(12) United States Patent
Fuergut et al.

(10) Patent No.: US 9,129,959 B2
(45) Date of Patent: Sep. 8, 2015

(54) METHOD FOR MANUFACTURING AN ELECTRONIC MODULE AND AN ELECTRONIC MODULE

(75) Inventors: Edward Fuergut, Dasing (DE); Irmgard Escher-Poeppel, Regensburg (DE); Gottfried Beer, Nittendorf (DE)

(73) Assignee: Infineon Technologies AG, Neubiberg (DE)

( * ) Notice: Subject to any disclaimer, the term of this patent is extended or adjusted under 35 U.S.C. 154(b) by 139 days.

(21) Appl. No.: 13/591,055

(22) Filed: Aug. 21, 2012

(65) Prior Publication Data
US 2014/0054780 A1 Feb. 27, 2014

(51) Int. Cl.
| H01L 21/50 | (2006.01) |
| H01L 23/498 | (2006.01) |
| H01L 23/538 | (2006.01) |
| H01L 25/065 | (2006.01) |
| H01L 23/00 | (2006.01) |
| H01L 21/56 | (2006.01) |

(52) U.S. Cl.
CPC .............. *H01L 21/50* (2013.01); *H01L 21/561* (2013.01); *H01L 21/568* (2013.01); *H01L 23/498* (2013.01); *H01L 23/5386* (2013.01); *H01L 23/5389* (2013.01); *H01L 24/18* (2013.01); *H01L 24/24* (2013.01); *H01L 24/25* (2013.01); *H01L 24/82* (2013.01); *H01L 24/96* (2013.01); *H01L 25/0655* (2013.01); *H01L 2224/24137* (2013.01); *H01L 2224/2518* (2013.01); *H01L 2224/82104* (2013.01); *H01L 2224/96* (2013.01); *H01L 2924/1301* (2013.01); *H01L 2924/1305* (2013.01); *H01L 2924/1306* (2013.01); *H01L 2924/13055* (2013.01); *H01L 2924/13062* (2013.01); *H01L 2924/13091* (2013.01)

(58) Field of Classification Search
CPC ............................................. H01L 2924/01079
USPC ........................................... 438/121; 257/762
See application file for complete search history.

(56) References Cited

U.S. PATENT DOCUMENTS

| 7,545,048 | B2 | 6/2009 | Meyer et al. |
| 8,183,696 | B2 | 5/2012 | Meyer et al. |
| 2003/0112578 | A1* | 6/2003 | Shaw et al. ................. 361/301.2 |
| 2007/0085204 | A1* | 4/2007 | Korec et al. ................... 257/737 |
| 2009/0014876 | A1* | 1/2009 | Youn et al. ..................... 257/738 |
| 2013/0049205 | A1* | 2/2013 | Meyer et al. .................. 257/773 |

* cited by examiner

*Primary Examiner* — Edward Wojciechowicz
(74) *Attorney, Agent, or Firm* — Slater & Matsil, L.L.P.

(57) ABSTRACT

A number of semiconductor chips each include a first main face and a second main face opposite from the first main face. The second main face includes at least one electrical contact element. The semiconductor chips are placed on a carrier. A material layer is applied into intermediate spaces between adjacent semiconductor chips. The carrier is removed and a first electrical contact layer is applied to the first main faces of the semiconductor chips so that the electrical contact layer is electrically connected with each one of the electrical contact elements.

26 Claims, 9 Drawing Sheets

METHOD FOR MANUFACTURING AN ELECTRONIC MODULE AND AN ELECTRONIC MODULE

TECHNICAL FIELD

The present invention relates to a method for manufacturing an electronic module and to an electronic module.

BACKGROUND

When fabricating electronic modules, in particular semiconductor chip modules, contact elements or contact pads on one or both main surfaces of the semiconductor chip have to be electrically connected to metallic sheets or layers. A basic challenge exists when semiconductor transistor chips, in particular semiconductor power transistor chips, have to be mounted in an electronic module, as in many cases a plurality of chips like, for example, transistor switches are connected in parallel with each other which means that the parallel switches have to comprise very similar and homogeneous characteristics with respect to input resistance and breakthrough voltage. Another challenge results from the fact that semiconductor materials like silicon, for example, have thermal expansion coefficients which are much smaller than those of metals so that in many cases intermediate layers have to be inserted between the semiconductor chip and the metallic layer in order to avoid thermally induced tensions in the semiconductor material which may cause cracks in the semiconductor chip and may ultimately lead to final damage of the semiconductor chip. The above problems can also occur with other kinds of semiconductor chips.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF ILLUSTRATIVE EMBODIMENTS

Figure 1:
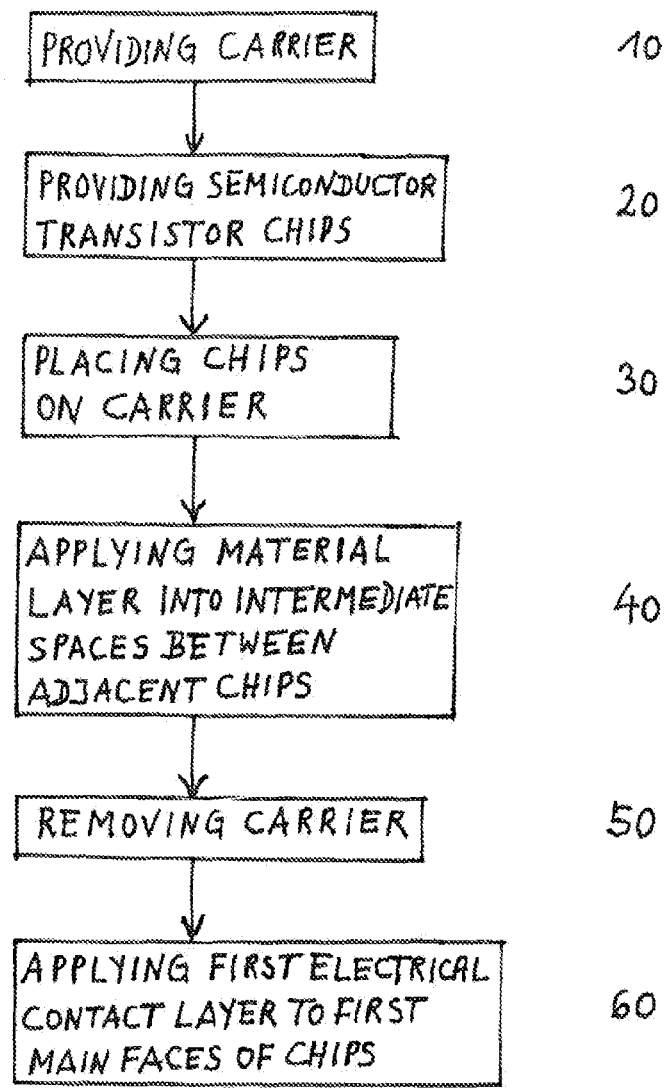
FIG. 1 shows a flow diagram for illustrating a method for manufacturing an electronic module according to the disclosure.
Figure 2:
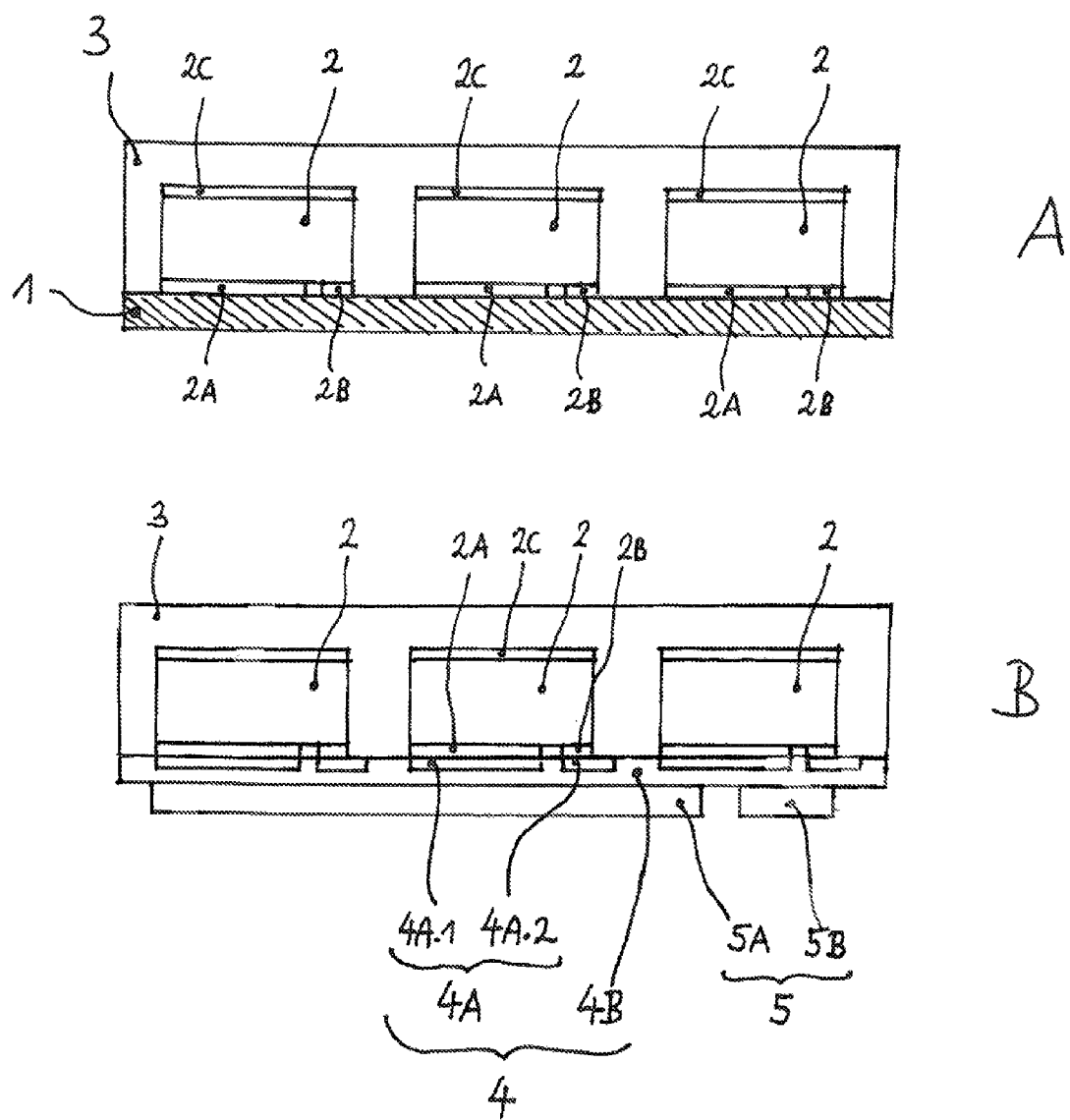
FIGS. 2A-D show schematic cross-sectional side view representations for illustrating a method for manufacturing an electronic module according to the disclosure.
Figure 2:
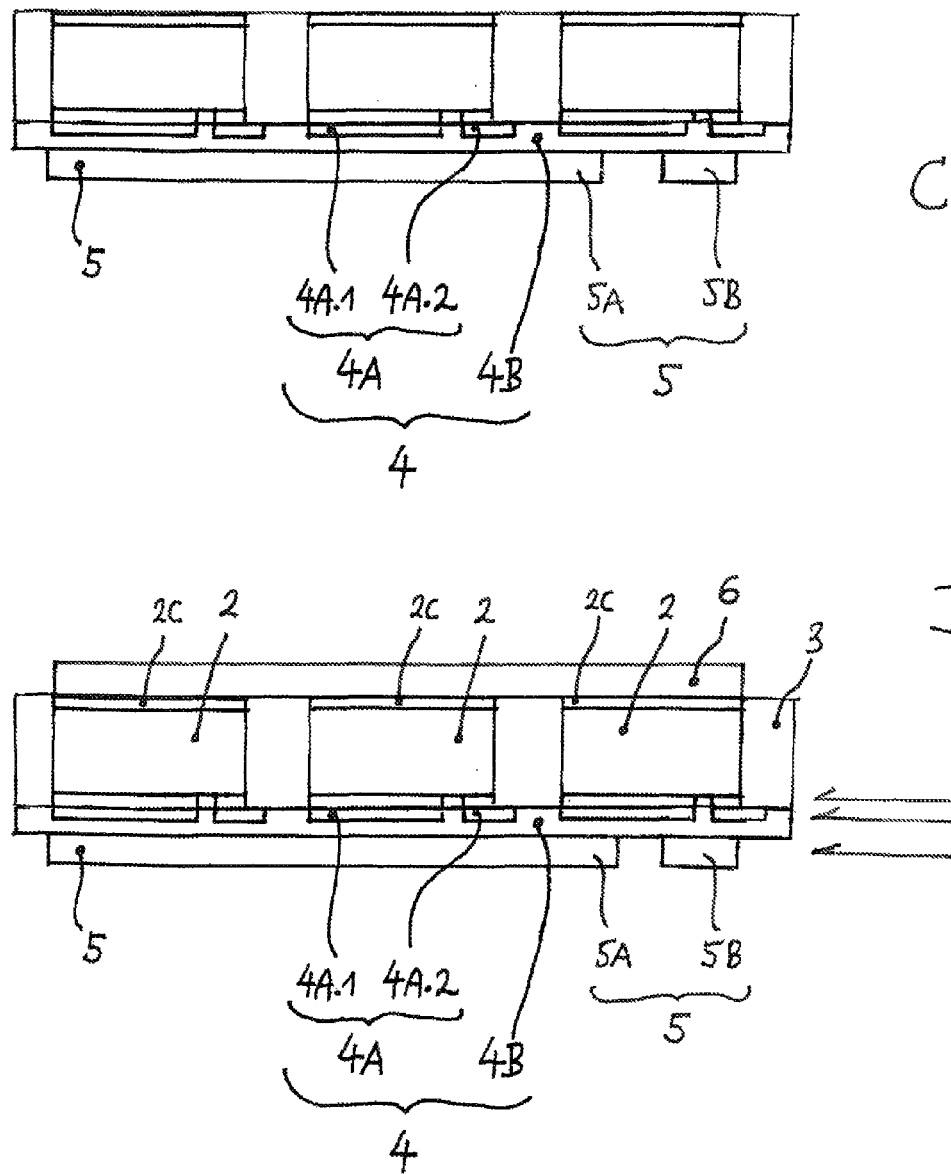

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include," "have," "with" or other variants thereof are used in either the detailed description or the claims, such terms are intended to be inclusive in a manner similar to the term "comprise." The terms "coupled" and "connected," along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of an electronic module and a method for manufacturing an electronic module may use various types of semiconductor chips. The embodiments may use semiconductor transistor chips comprising MOS transistor structures like vertical or planar MOS transistor structures. Vertical transistor structures may comprise, for example IGBT (Insulated Gate Bipolar Transistor) structures or, in general, transistor structures in which at least one electrical contact terminal is arranged on a first main face of the semiconductor chip and at least one other electrical contact terminal is arranged on a second main face of the semiconductor chip opposite to the first main face of the semiconductor chip. The embodiments may also use semiconductor transistor chips comprising planar MOS transistor structures like, for example, J-FET transistor structures. The embodiments may also use semiconductor chips comprising a gate turn-off (GTO) thyristor. The embodiments may also use power transistor or high voltage transistor chips wherein the term high voltage may have a meaning of voltages higher than 100V, for example.

In several embodiments layers or layer stacks are applied to one another or materials are applied or deposited onto layers. It should be appreciated that any such terms as "applied" or "deposited" are meant to cover literally all kinds and techniques of applying layers onto each other. In particular, they are meant to cover techniques in which layers are applied at once as a whole like, for example, laminating techniques as well as techniques in which layers are deposited in a sequential manner like, for example, sputtering, plating, molding, CVD, etc.

Referring to FIG. 1, there is shown a flow diagram for illustrating a method for manufacturing an electronic module according to the disclosure. The method 100 of FIG. 1 comprises providing a carrier (10), providing a plurality of semiconductor chips, each one comprising a first main face and a second main face opposite to the first main face, the second main face comprising at least one electrical contact element (20), placing the plurality of semiconductor chips on the carrier (30), applying a material layer into intermediate spaces between adjacent semiconductor chips (40), removing the carrier (50), and applying a first electrical contact layer to the first main faces of the semiconductor chips so that the first electrical contact layer is electrically connected with each one of the electrical contact elements (60).

One essential aspect of the above method is that arranging and electrically contacting the semiconductor chips can be performed by means of a chip embedding technology, in particular an extended wafer level technology. The semiconductor chips can be pre-fabricated on a semiconductor wafer and then diced out of the semiconductor wafer so that they can be provided as separate and freely handable chips. These chips can then be placed on the carrier. The chips can be relatively small, i.e., comprising side edges having a length in a range between 1 mm and 5 mm. Therefore, one basic concept of the method is not to use one large semiconductor chip and electrically connecting portions of this large chip in parallel, but instead to use a plurality of small semiconductor chips and electrically connecting them in parallel by means of a chip embedding technology, in particular an extended wafer level package technology. One advantage of the method is therefore that the semiconductor chips can be selected in such a way that within the plurality of semiconductor chips there will be a high degree of homogeneity with respect to characteristic parameters like, for example, input resistance RON and break-through voltage. Therefore an overall increase of production yield can be obtained by the above method. Moreover, by using many small semiconductor chips instead of one large chip, the overall thermal mechanical stress between the chips and the metal contacts can be reduced.

The semiconductor chips can be identical within the electronic module. They can be one or more of power transistor chips, field-effect transistor chips, vertical transistor chips, and insulated gate bipolar transistor (IGBT) chips, gate turn-off thyristor (GTO) chips, and planar transistor chips. In particular, the chips may comprise contact elements on each one of the first and second main faces. More specifically, the chips may comprise one electrical contact element at the first main face and two electrical contact element at the second main face.

The chips can be placed in the form of a matrix on the carrier wherein the same number of chips can be arranged along the rows and along the columns of the matrix.

The material layer can be any sort of encapsulation layer commonly used in semiconductor chip package technology. In particular, the material layer may comprise one or more of an epoxy material, in particular an epoxy-b-stage material, an acrylate material, a polymer material, a polyimide material, and a PBO material.

The first and second electrical contact layers can be deposited by galvanical or electro-chemical deposition or plasma-dust deposition. As materials for the first and second electrical contact layers copper or a copper alloy can be used.

Referring to FIGS. 2A-D there are shown schematic cross-sectional side view representations for illustrating a method for manufacturing an electronic module according to the disclosure. According to FIG. 2A a carrier 1 can be provided and on an upper surface of the carrier 1 a plurality of semiconductor chips 2 can be arranged in the form of a matrix as, for example, a 3×3 matrix. The semiconductor chips 2 can be, for example, vertical transistor chips like IGBT chips. The semiconductor chips may each comprise two contact pads 2A and 2B on a second main face and one contact pad 2C on a first main face opposite to the second main face. The contact pads 2A and 2B can be the source and gate contacts and the contact pad 2C can be the drain contact of the IGBT, respectively. The semiconductor chips can be placed and adhered on the carrier 1 by means of a common pick-and-place technology. After placing the semiconductor chips 2 on the carrier 1, a material layer 3 can be applied onto the semiconductor chips 2 in such a way that it is filled into intermediate spaces between adjacent semiconductor chips 2 and also covers the upper, first main faces of the semiconductor chips 2. The material layer 3 can be, for example, comprised of an epoxy material.

In the following FIGS. 2B-2D the application of a first electrical contact layer 6 and a second electrical contact layer 5 will be shown. FIG. 2B shows an intermediate product after removal of the carrier 1 and application of a redistribution layer 4 and the second electrical contact layer 5 comprising partial layers 5A and 5B. Due to the application and subsequent hardening of material layer 3 a semiconductor chip panel is produced which gets its stiffness from the material layer 3 alone so that the carrier 1 can be removed. Thereafter, a redistribution layer 4 is applied to the lower surface of the semiconductor chip panel and thus also to the lower second surfaces of the semiconductor chips 2. The redistribution layer 4 serves the purpose to electrically connect the contact pads 2A and 2B of the individual semiconductor chips 2 with the second electrical contact layer 5, namely with one of its partial layers 5A and 5B. The redistribution layer 4 may comprise a metallization layer 4A and an insulation layer 4B. The metallization layer 4A may comprise first areas 4A.1 arranged underneath and connected with first contact pads 2A and second areas 4A.2 arranged underneath and connected with second contact pads 2B. The insulation layer 4B can, for example, be made of a polyimide layer or by an epoxy layer or an epoxy foil and is deposited on the metallization layer 4A. As will be shown in FIGS. 3A-C in some more detail, the insulation layer 4B may contain electrical traces connecting each one of the second areas 4A.2 with the partial layer 5B of the second electrical contact layer 5. The second electrical contact layer 5 can be deposited onto the insulation layer 4B by galvanical deposition or, alternatively, by plasma-dust deposition or, alternatively by a printed, sintered paste like, for example, a printed, sintered silver paste.

FIG. 2C shows the semiconductor chip panel after removing an upper portion of the material layer 3 down to the first surfaces of the semiconductor chips 2 until the contact pads 2C are exposed. Removal of this upper portion of the material layer 3 can be performed by, for example, grinding.

FIG. 2D shows the semiconductor chip panel after deposition of a first electrical contact layer 6 onto the upper surface of the semiconductor chip panel. The first electrical contact layer 6 can also be deposited by means of galvanical deposition or, alternatively, by plasma-dust deposition or, alternatively by a printed, sintered paste like, for example, a printed, sintered silver paste.

Figure 3A:
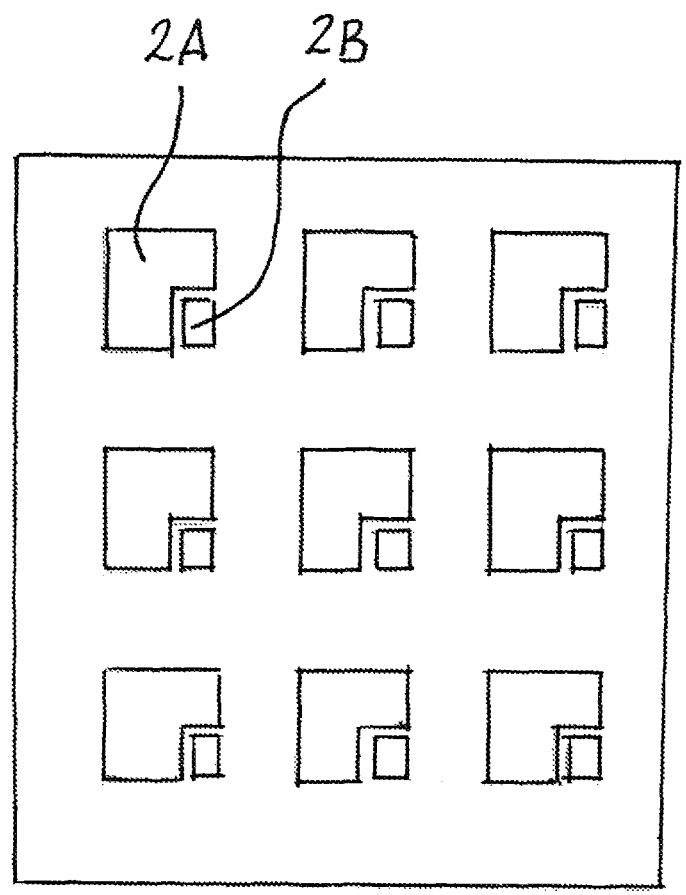
FIGS. 3A-C show schematic cross-sectional down view representations of different planes of the electronic module as shown in FIG. 2D.
Figure 3B:
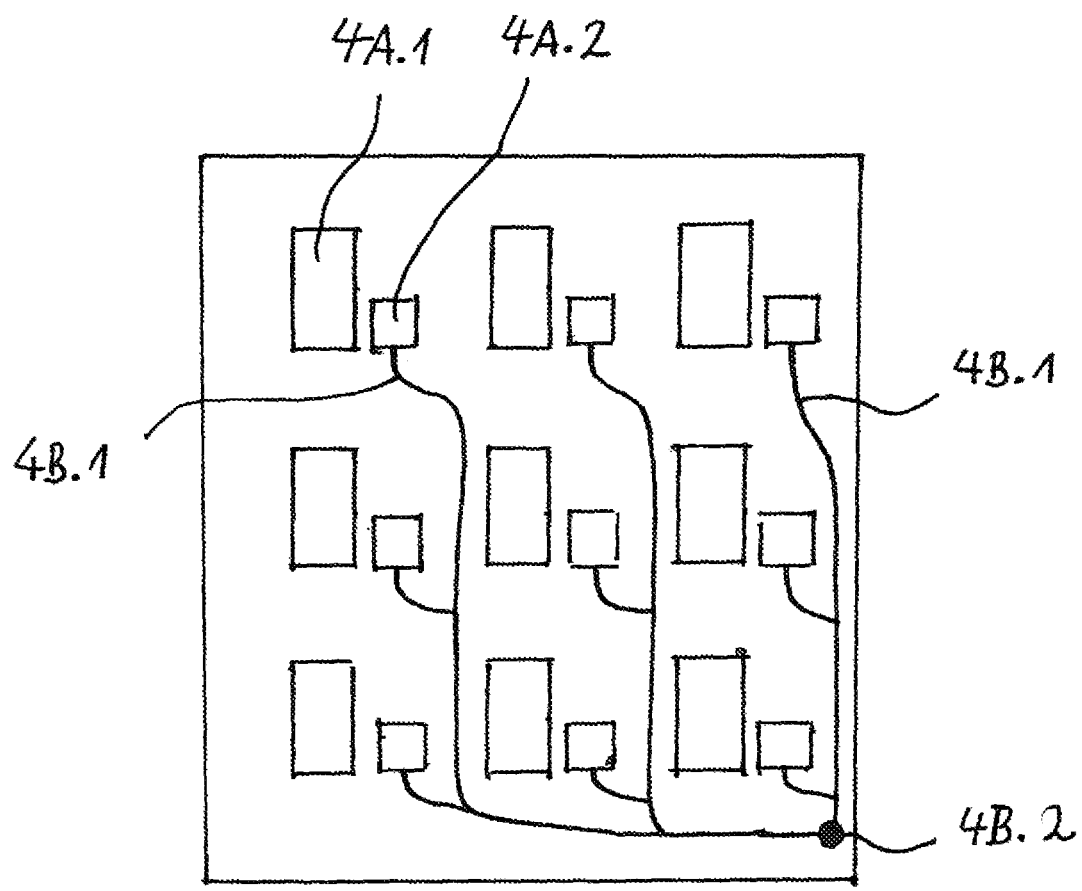
Figure 3C:
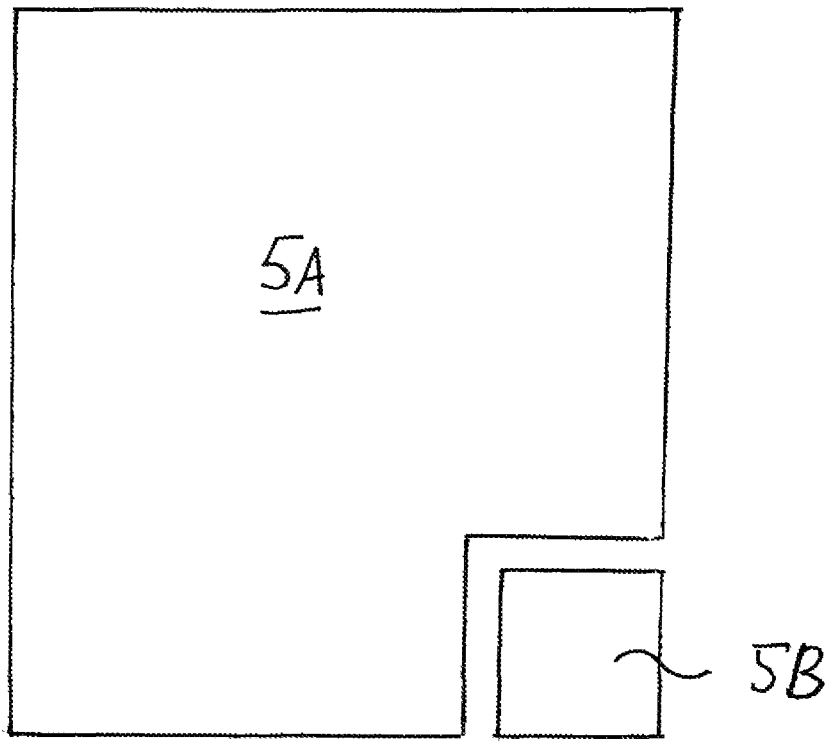
Figure 4:
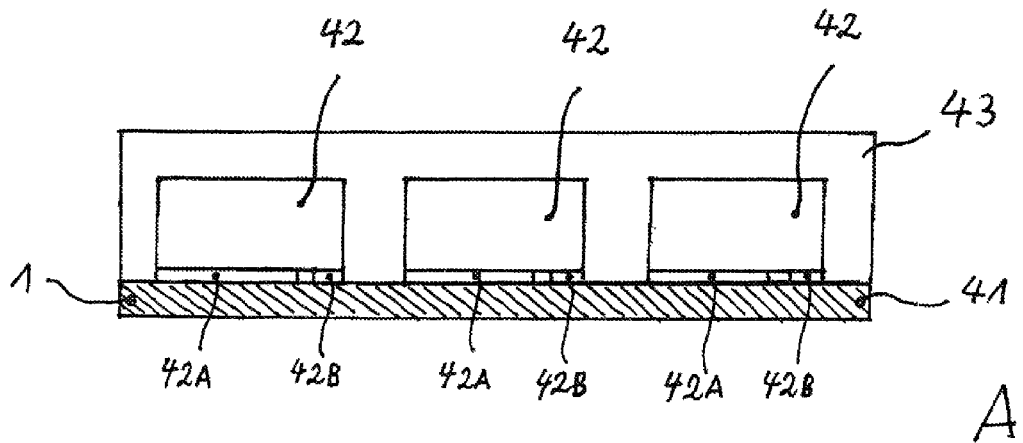
FIGS. 4A-D show schematic cross-sectional side view representations for illustrating a method for manufacturing an electronic module according to the disclosure.
Figure 4:
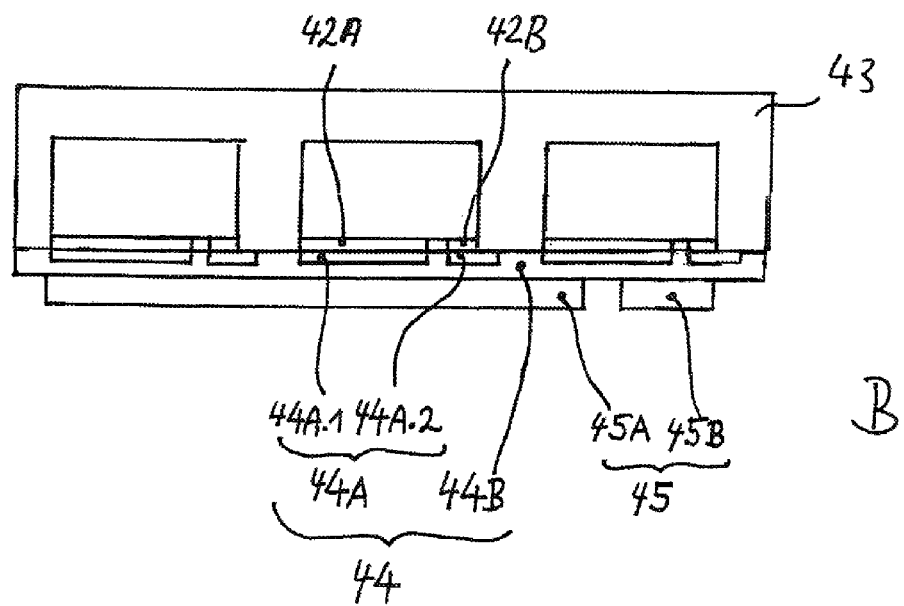
Figure 4:
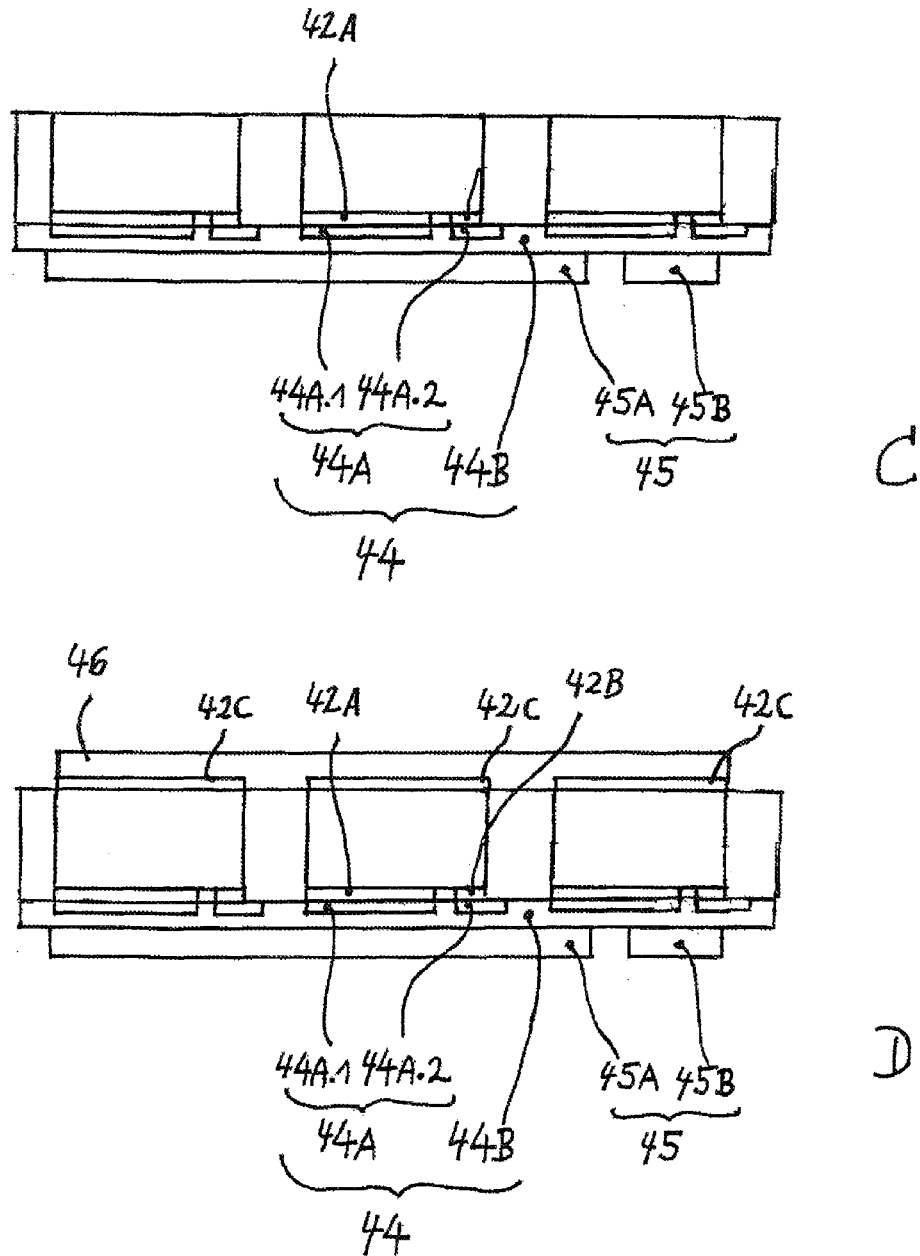

Referring to FIGS. 3A-C there are shown cross-sectional representations of planes A-C as designated in FIG. 2D for illustrating the way of electrically connecting the contact pads 2A and 2B with the partial layers 5A and 5B of the second electrical contact layer 5. FIG. 3A shows the contact pads 2A and 2B. FIG. 3B shows the metallization layer 4A consisting of first areas 4A.1 and 4A.2 wherein the first areas 4A.1 are connected with the first contact pads 2A and the second areas 4A.2 are connected with the second contact pads 2B of the semiconductor chips 2, respectively. FIG. 3B shows also a plurality of electrical traces 4B.1 connecting each one of the second areas 4A.2 of the metallization layer 4A with an electrical through-connection 4B.2 which is connected with the partial layer 5B of the second electrical contact layer 5. FIG. 3C finally shows a cross-section along a plane of the second electrical contact layer 5 consisting of the first partial layer 5A and the second partial layer 5B. The insulation layer 4B contains further electrical through-connections for connecting each one of the first areas 4A.1 of the metallization layer 4A with the first partial layer 5A of the second electrical contact layer 5.

It is also possible that the semiconductor chips are such that they have contact pads only on one of their main surfaces and that an electrical contact layer is only applied to that particular main surface. The electrical contact layer may be fabricated and structured like one of the first and second contact layers 6 and 5 of FIGS. 2A-D. It may also have more than two partial layers, if more than two contact pads are present on the main surface of the semiconductor chip, which are to be connected to the partial layers of the electrical contact layer.

Referring to FIGS. 4A-D, there are shown schematic cross-sectional side view representations for illustrating a method for manufacturing an electronic module according to the disclosure. In the following only differences with respect to the embodiment shown in FIGS. 2A-D are illustrated. Otherwise reference is made to the above description of FIGS. 2A-D. One essential aspect of the embodiment of FIGS. 4A-D is that the semiconductor chips 42 are used which can be comprised of vertical transistor chips wherein, however, no contact pads were fabricated on the first, upper surfaces of the chips 42. The semiconductor chips 42 can be, for example, comprised of IGBT chips such as those used in FIGS. 2A-D. The semiconductor chips 42, however, only have contact pads 42A and 42B on the second lower surface, in particular source and gate contacts. After removing the carrier 41 and grinding of the upper portion of the material layer 43 until the upper surfaces of the semiconductor chips 42, contact pads 42C, in particular drain contacts, are fabricated on the first upper surfaces of the semiconductor chips 42 and thereafter the first electrical contact layer 46 is deposited onto the upper surface of the semiconductor chip panel and thus also on the contact pad 42C of the semiconductor chips 42. It is also possible that before fabricating contact pads 42C an ion implantation step can be performed on each one of the semiconductor chips 42 as a final step of fabricating the vertical transistor structures within the semiconductor chips 42. The redistribution layer 44 and the second electrical contact layer 45 correspond to the redistribution layer 4 and the second electrical contact layer 5 of FIGS. 2A-D, respectively.

Figure 5:
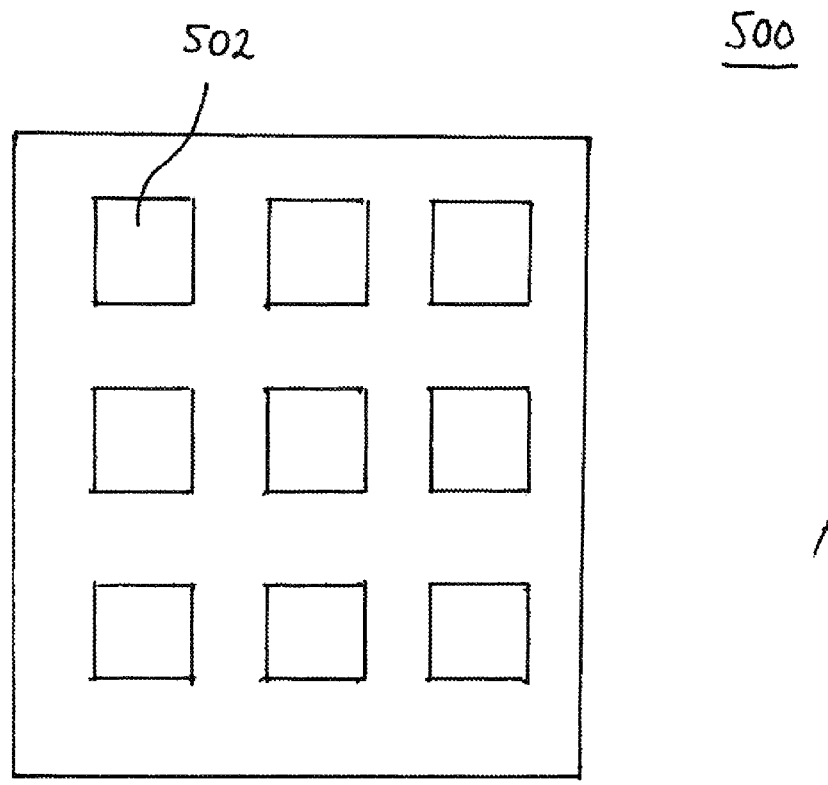
FIGS. 5A, B show a top view representation (A) and a cross-sectional side view representation (B) of an electronic module according to the disclosure.
Figure 5:
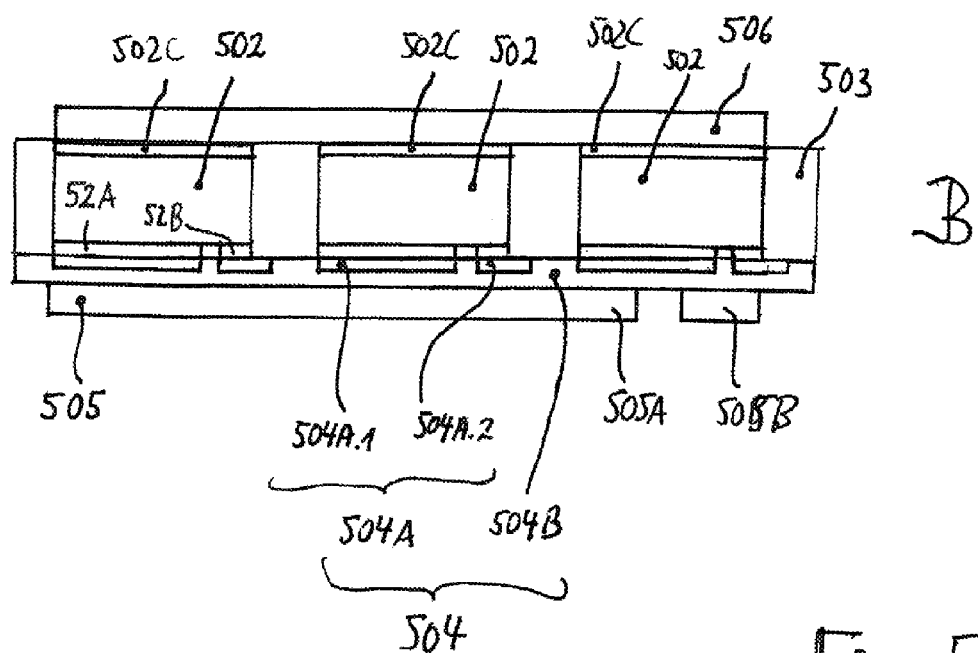

Referring to FIGS. 5A,B, there are shown a top view representation (A) and a cross-sectional side view representation (B) of an electronic module according to the disclosure. The electronic module 500 of FIG. 5 comprises a plurality of semiconductor chips 502, each one comprising a first main face and a second main face opposite to the first main face, a material layer 503 disposed in intermediate space between adjacent semiconductor chips 502, a second electrical contact layer 505 disposed above second main faces of the semiconductor chips 502, and a first electrical contact layer 506 disposed on first main faces of the semiconductor chips 502.

The semiconductor chips 502 can be one or more of power transistor or high voltage transistor chips wherein the term high voltage may have a meaning of voltages higher than 100V, for example. The semiconductor chips may be comprised of one or more of field-effect transistor chips, vertical transistor chips, insulated gate bipolar transistor (IGBT) chips, gate turn-off (GTO) thyristor chips, and planar transistor chips. In particular, the semiconductor chips 502 can be identical in function and structure and in particular can be fabricated in an identical manner. It is further possible that at least one of the chips of the matrix, as shown in FIG. 5A, is different from the other chips and may fulfill a different function. This one semiconductor chip can, for example, be comprised of a logic chip which may be employed for controlling the operation of the semiconductor chips 502.

The electronic module 500 of FIG. 5 may further comprise a redistribution layer 504 which may contain a metallization layer 504A and an insulation layer 504B. The metallization layer 504A may contain first areas 504A.1 and second areas 504A.2 wherein the first areas 504A.1 are connected with contact pads 502A and the second areas 504A.2 are connected with contact pads 502B, respectively. The insulation layer 504B may contain electrical traces connecting the second areas 502B with a second partial layer 505B of the second electrical contact layer 505. Reference is made herewith to the above explanations in connection with FIGS. 2A-D.

The semiconductor chips 502 can be comprised of IGBT chips and the electrical contact pads 502C on the first main faces of the chips 502 can be comprised of the drain contacts and the electrical contact pads 52A can be comprised of the source contacts and the electrical contact pads 52B can be comprised of the gate contacts of the IGBT chips, respectively. One important aspect of the electronic module 500 of FIGS. 5A,B is that all drain contacts 502C can be electrically connected to one electrical layer 506, all source contacts 52A can be electrically connected to one electrical layer 505A, and all gate contacts 52B can be electrically connected to one electrical layer 505B.

Another important aspect of the electronic module 500 of FIG. 5A,B is that all semiconductor chips 502 can be embedded in the material layer 503 from all four sides, respectively, so that all four side faces of the semiconductor chips 502 are covered with the material layer 503.

It is to be noted herewith that further specific embodiments of the electronic module 500 can be formed together with specific features and embodiments as were described above in connection with one of FIGS. 1-4.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A method for manufacturing an electronic module, the method comprising:
   arranging a plurality of semiconductor chips on a carrier laterally adjacent along rows and columns in form of a matrix, each semiconductor chip comprising a vertical electrical device, a first main face and a second main face opposite the first main face, the first main face comprising at least one electrical contact and the second main face comprising at least one electrical contact, wherein only the at least one electrical contact on the second main face has a contact pad disposed thereon and the at least one electrical contact on the first main face is devoid of a contact pad;

forming a material layer over each semiconductor chip and in intermediate spaces between the semiconductor chips;

removing the carrier from the second main faces of the semiconductor chips;

forming a redistribution layer on the second main faces of the semiconductor chips;

forming a second electrical contact layer on the redistribution layer;

removing the material layer above the semiconductor chips thereby exposing the first main faces of the semiconductor chips;

forming a contact pad for electrical connection on each of the at least one electrical contacts on the first main faces of the semiconductor chips, wherein before forming the contact pads an ion implantation is performed on each of the semiconductor chips as a final step of fabricating the vertical electrical device within the semiconductor chips; and forming a first continuous electrical contact layer on the contact pads of the first main faces of the semiconductor chips so that the first continuous electrical contact layer is electrically connected with each one of the electrical contacts of the semiconductor chips, wherein the first continuous electrical contact layer covers the entire matrix of semiconductor chips.

2. The method according to claim 1, wherein the semiconductor chips comprise a plurality of one or more of power transistor chips, field-effect transistor chips, insulated gate bipolar transistor (IGBT) chips, and gate turn-off thyristor chips.

3. The method according to claim 1, wherein the semiconductor chips comprise two electrical contacts at the second main face and one electrical contact at the first main face.

4. The method according to claim 1, wherein the material layer comprises one or more materials selected from the group consisting of an epoxy material, an acrylate material, a polymer material, a polyimide material, and a PBO material.

5. The method according to claim 1, wherein each of the semiconductor chips comprises a first electrical contact and a second electrical contact at the second main face, the method further comprising:

forming the second electrical contact layer on the redistribution layer such that a first portion of the second electrical contact layer electrically connects the first electrical contacts and such that a second portion of the second electrical contact layer electrically connects the second electrical contacts.

6. The method according to claim 5, wherein the first and second portions of the second electrical contact layer are deposited by one or more of galvanical deposition, plasma-dust deposition and deposition of a printed, sintered paste.

7. The method according to claim 5, wherein the first and second portions of the second electrical contact layer comprise copper or a copper alloy.

8. The method according to claim 1, wherein the semiconductor chips each comprise one electrical contact at the first main face, and wherein the first continuous electrical contact layer comprises a metallic or metal containing layer above the first main faces of the semiconductor chips.

9. The method according to claim 8, wherein the first continuous electrical contact layer is deposited by one or more of galvanical deposition, plasma-dust deposition and deposition of a printed, sintered paste.

10. The method according to claim 8, wherein the first continuous electrical contact layer comprises copper or a copper alloy.

11. A method for manufacturing an electronic module, the method comprising:

arranging semiconductor chips on a carrier laterally adjacent along rows and columns in form of a matrix, wherein the semiconductor chips comprise a plurality of vertical transistor chips and a logic chip configured to control the plurality of vertical transistor chips, wherein the vertical transistor chips each comprises a first main face and a second main face opposite the first main face, the first main face comprising at least one electrical contact and the second main face comprising at least one electrical contact wherein only the at least one electrical contact on the second main face has a contact pad disposed thereon, and the electrical contact on the first main face is devoid of a contact pad;

forming a material layer over each semiconductor chip and in intermediate spaces between adjacent semiconductor chips;

removing the carrier from the second main faces of the semiconductor chips;

forming a redistribution layer on the second main faces of the semiconductor chips;

forming a second electrical contact layer on the redistribution layer;

removing the material layer over the semiconductor chips to expose the first main faces of the vertical transistor chips;

forming contact pads for electrical connection on the at least one electrical contacts on the first main faces of the vertical transistor chips; and forming a first electrical contact layer on the first main faces of the semiconductor chips so that the first electrical contact layer is electrically connected with each of the electrical contacts of the vertical transistor chips, wherein the first electrical contact layer covers the entire matrix of semiconductor chips, and wherein the first electrical contact layer is not perforated.

12. The method according to claim 11, wherein the plurality of vertical transistor chips comprises one or more of a group of power bipolar transistors, IGBTs, power MOSFETs, JFTs, high voltage transistors or power diodes.

13. The method according to claim 11, wherein the plurality of vertical transistor chips comprises one or more power transistors, field-effect transistors, insulated gate-bipolar transistors, or gate turn-off thyristors.

14. The method according to claim 11, wherein each of the plurality of vertical transistor chips comprises two electrical contacts at the second main face and one electrical contact at the first main face.

15. The method according to claim 11, wherein the material layer comprises one or more materials selected from the group consisting of an epoxy material, an acrylate material, a polymer material, a polyimide material, and a PBO material.

16. The method according to claim 11, wherein removing the material layer over the first main faces of the semiconductor chips comprises one or more of grinding, milling, etching, and chemical mechanical polishing (CMP).

17. The method according to claim 11, wherein each of the vertical transistor chips comprises a first electrical contact pad and a second electrical contact pad at the second main face, wherein a second electrical contact layer is connected to the second main faces of the vertical transistor chips such that the first electrical contact pads are connected to a first portion of the second electrical contact layer, and such that the second electrical contact pads are connected to a second portion of the second electrical contact layer.

18. The method according to claim 17, wherein the redistribution layer comprises a metallization layer and an insulation layer, the metallization layer comprising first metallization areas and second metallization areas, each one of the first metallization areas being connected with one of the first electrical contact pads and each one of the second metallization areas being connected with one of the second electrical contact pads, and each one of the first metallization areas being connected to the first portion of the second electrical contact layer and each one of the second metallization areas being connected to the second portion of the second electrical contact layer.

19. The method according to claim 17, wherein forming the first and second portions of the second electrical contact layers comprises one or more of galvanical deposition, plasma-dust deposition and deposition of a printed, sintered paste.

20. The method according to claim 17, wherein the first and second portions of the second electrical contact layers comprise copper or a copper alloy.

21. The method according to claim 11, wherein forming the first electrical contact layer comprises applying a contiguous metallic or metal containing layer on the first main faces of the semiconductor chips.

22. The method according to claim 11, wherein forming the first electrical contact layer comprises one or more of galvanic deposition, plasma-dust deposition and deposition of a printed, sintered paste.

23. The method according to claim 11, wherein the first electrical contact layer comprises copper or a copper alloy.

24. A method for manufacturing an electronic module, the method comprising:
arranging a plurality of semiconductor chips on a carrier laterally adjacent along rows and columns in form of a matrix, each semiconductor chip comprising a first main face and a second main face opposite the first main face, each semiconductor chip comprising a first electrical contact on the first main face, and a second electrical contact and a third electrical contact on the second main face, wherein the second electrical contact and the third electrical contact comprise contact pads and the first electrical contact is devoid of a contact pad;
forming a material layer over each semiconductor chip and into intermediate spaces between adjacent semiconductor chips;
removing the material layer over the semiconductor chips to expose the first main face of the semiconductor chips;
forming a contact pad for electrical connection on each of the first electrical contacts of the semiconductor chips;
forming a first electrical contact layer on the first main face such that the first electrical contact layer connects the first electrical contacts, wherein the first electrical contact layer covers the entire matrix of semiconductor chips;
removing the carrier from the second main faces of the semiconductor chips;
forming a redistribution layer on the second main faces of the semiconductor chips; and
forming a second electrical contact layer on the redistribution layer such that a first portion of the second electrical contact layer contacts the second electrical contacts and such that a second portion of the second electrical contact layer contacts the third electrical contacts.

25. A method for manufacturing an electronic module, the method comprising:
arranging a plurality of semiconductor chips on a carrier laterally adjacent along rows and columns in form of a matrix, each semiconductor chip comprising a first main face and a second main face opposite the first main face, the first main face comprising at least one electrode devoid of an electrical contact pad;
forming a material layer over each semiconductor chip and in intermediate spaces between the semiconductor chips; removing the material layer above the semiconductor chips thereby exposing the electrodes on the first main face of the semiconductor chips;
forming electrical contact pads on the electrodes on the first main faces of the semiconductor chips; and
forming a first electrical contact layer above the first main faces of the semiconductor chips so that the first electrical contact layer is electrically connected with each one of the electrical contact pads of the semiconductor chips, wherein the first electrical contact layer covers the entire matrix of semiconductor chips, and wherein the first electrical contact layer is not perforated.

26. The method according to claim 11, wherein an ion implantation is performed on each of the vertical transistor chips to prepare vertical structures within the vertical transistor chips before the at least one contact pad is disposed on the first main face of each vertical transistor chip.

* * * * *